(12) United States Patent
Wakiyama

(10) Patent No.: US 10,153,314 B2
(45) Date of Patent: Dec. 11, 2018

(54) SEMICONDUCTOR APPARATUS, SOLID-STATE IMAGE PICKUP DEVICE, IMAGE PICKUP APPARATUS, AND ELECTRONIC APPARATUS

(71) Applicant: SONY CORPORATION, Tokyo (JP)

(72) Inventor: Satoru Wakiyama, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 15/531,841

(22) PCT Filed: Dec. 2, 2015

(86) PCT No.: PCT/JP2015/083898
§ 371 (c)(1),
(2) Date: May 31, 2017

(87) PCT Pub. No.: WO2016/098594
PCT Pub. Date: Jun. 23, 2016

(65) Prior Publication Data
US 2017/0323917 A1    Nov. 9, 2017

(30) Foreign Application Priority Data

Dec. 16, 2014    (JP) ................. 2014-254158

(51) Int. Cl.
*H01L 27/14* (2006.01)
*H01L 27/146* (2006.01)

(52) U.S. Cl.
CPC ........ *H01L 27/14618* (2013.01); *H01L 27/14* (2013.01); *H01L 27/14687* (2013.01)

(58) Field of Classification Search
CPC ............. H01L 25/167; H01L 27/14618; H01L 27/14687
See application file for complete search history.

(56) References Cited

U.S. PATENT DOCUMENTS

2006/0035402 A1* 2/2006 Street ............... H01L 27/14634
                                                         438/66
2009/0174804 A1    7/2009 Iijima et al.
(Continued)

FOREIGN PATENT DOCUMENTS

EP        2614521 A1    7/2013
EP        2940090 A1    11/2015
(Continued)

OTHER PUBLICATIONS

International Search Report and Written Opinion of PCT Application No. PCT/JP2015/083898, dated Feb. 9, 2016, 02 pages of English Translation and 07 pages of ISRWO.

*Primary Examiner* — Daniel Shook
(74) *Attorney, Agent, or Firm* — Chip Law Group

(57) ABSTRACT

The present technology relates to a semiconductor apparatus, a solid-state image pickup device, an image pickup apparatus, and an electronic apparatus capable of improving impedance characteristics while preventing an occurrence of a flare and an interference due to a bonding jig, and achieving downsizing an apparatus. By aligning the heights of a cover glass and a semiconductor device, a distance between the cover glass and the semiconductor device is set to be minimum, and thus it is possible to suppress an occurrence of a flare due to incident light reflected on a side surface of the semiconductor device, and improve the impedance characteristics of the semiconductor device and the semiconductor image pickup device. Further, the interference of the jig used for the semiconductor device is reduced. The present technology can be applied to a CMOS image sensor.

9 Claims, 9 Drawing Sheets

(56) References Cited

U.S. PATENT DOCUMENTS

2012/0061853 A1    3/2012   Su et al.
2015/0293281 A1   10/2015   Ezoe et al.

FOREIGN PATENT DOCUMENTS

| | | |
|---|---|---|
| JP | 2003-101002 A | 4/2003 |
| JP | 2009-088200 A | 4/2009 |
| JP | 2009-207158 A | 9/2009 |
| JP | 2013-539910 A | 10/2013 |
| JP | 2014-142628 A | 8/2014 |
| WO | 2007/132717 A1 | 11/2007 |
| WO | 2012/034064 A1 | 3/2012 |
| WO | 2014/104136 A1 | 7/2014 |

* cited by examiner

SEMICONDUCTOR APPARATUS, SOLID-STATE IMAGE PICKUP DEVICE, IMAGE PICKUP APPARATUS, AND ELECTRONIC APPARATUS

CROSS REFERENCE TO RELATED APPLICATIONS

This application is a U.S. National Phase of International Patent Application No. PCT/JP2015/083898 filed on Dec. 2, 2015, which claims priority benefit of Japanese Patent Application No. JP 2014-254158 filed in the Japan Patent Office on Dec. 16, 2014. Each of the above-referenced applications is hereby incorporated herein by reference in its entirety.

TECHNICAL FIELD

The present technology relates to a semiconductor apparatus, a solid-state image pickup device, an image pickup apparatus, and an electronic apparatus, and particularly to a semiconductor apparatus, a solid-state image pickup device, an image pickup apparatus, and an electronic apparatus capable of improving impedance characteristics while preventing an occurrence of a flare and an interference of a jig in bonding of a semiconductor device.

BACKGROUND ART

To prevent pixel damage due to particles during a semiconductor mounting process, such a technology has been proposed that a cover glass cut into pieces is bonded onto a semiconductor image pickup device by using transparent resin for protection (see, Patent Literature 1).

CITATION LIST

Patent Literature

Patent Literature 1: Japanese Patent Application Laid-open No. 2010-153874

DISCLOSURE OF INVENTION

Technical Problem

However, in the semiconductor apparatus described in Patent Literature 1, in a case where a semiconductor device is mounted to be adjacent to a pixel, if a height of the semiconductor device is more than that of a surface of a cover glass on the pixel, there is a fear that a flare generated from an end surface of the semiconductor device or an end surface of an adhesive material affects optical characteristics.

Further, in a case where a thickness of the semiconductor device is lower than the surface of the cover glass, a bonding jig causes an interference at a time of bonding the semiconductor device, so it is impossible to reduce a distance between the semiconductor device and the cover glass as compared to a size specified by the size of the bonding jig.

the present technology has been made in view of the circumstances as described above, and in particular, makes it possible to improve impedance characteristics while preventing an occurrence of a flare and an interference due to a jig in bonding.

Solution to Problem

According to an aspect of the present technology, there is provided a semiconductor apparatus, including: a cover glass that is bonded on a pixel with a transparent heat-resistant resin and cut into pieces to protect the pixel before a semiconductor image pickup device is cut into pieces from a wafer state; a semiconductor device mounted to be adjacent to the semiconductor image pickup device; and an underfill resin that is filled in a gap between the cover glass and the semiconductor device and in a periphery of the cover glass and the semiconductor device.

The transparent heat-resistant resin can have such a thickness (micrometer) that a value obtained by multiplying the thickness by a specific gravity of the transparent heat-resistant resin is more than 42 um (micrometer).

The transparent heat-resistant resin can transmit light having a wavelength of 400 nm or more by 99% or more.

A height from the pixel on the semiconductor device to a back surface of glass bonded on a pixel can be equal to a height to a back surface of the semiconductor device mounted to be adjacent thereto.

The underfill resin can have a transmittance of light within a range of 380 nm to 1200 nm of 0%.

According to another aspect of the present technology, there is provided a solid-state image pickup device, including: a cover glass that is bonded on a pixel with a transparent heat-resistant resin and cut into pieces to protect the pixel before a semiconductor image pickup device is cut into pieces from a wafer state; a semiconductor device mounted to be adjacent to the semiconductor image pickup device; and an underfill resin that is filled in a gap between the cover glass and the semiconductor device and in a periphery of the cover glass and the semiconductor device.

According to another aspect of the present technology, there is provided an image pickup apparatus, including: a cover glass that is bonded on a pixel with a transparent heat-resistant resin and cut into pieces to protect the pixel before a semiconductor image pickup device is cut into pieces from a wafer state; a semiconductor device mounted to be adjacent to the semiconductor image pickup device; and an underfill resin that is filled in a gap between the cover glass and the semiconductor device and in a periphery of the cover glass and the semiconductor device.

According to another aspect of the present technology, there is provided an electronic apparatus, including: a cover glass that is bonded on a pixel with a transparent heat-resistant resin and cut into pieces to protect the pixel before a semiconductor image pickup device is cut into pieces from a wafer state; a semiconductor device mounted to be adjacent to the semiconductor image pickup device; and an underfill resin that is filled in a gap between the cover glass and the semiconductor device and in a periphery of the cover glass and the semiconductor device.

In the aspects of the present technology, before the semiconductor image pickup device is cut into pieces from the wafer state, the cover glass cut into pieces bonded on the pixel with the transparent heat-resistant resin protects the pixel, and the underfill resin is filled in the gap between the cover glass and the semiconductor device mounted to be adjacent to the semiconductor image pickup device, and the periphery of the cover glass and the semiconductor device.

Advantageous Effects of Invention

According to the aspects of the present technology, it is possible to improve the impedance characteristics while preventing an occurrence of a flare and an interference due to a jig at a time of bonding a semiconductor apparatus.

MODE(S) FOR CARRYING OUT THE INVENTION

<Structure of Solid-State Image Pickup Device in Related Art>

Figure 1:
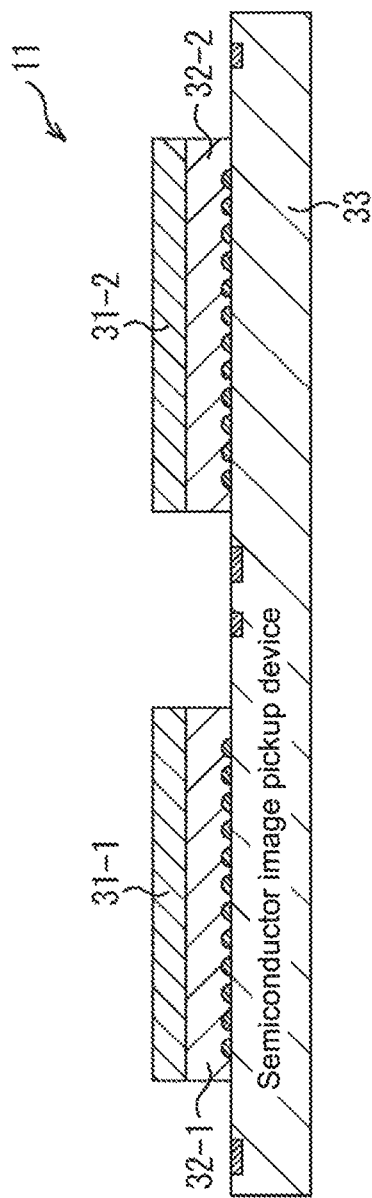
FIG. 1 A diagram for explaining a manufacturing process using a semiconductor image pickup device in related art.

FIG. 1 is a side view showing a specific step in a manufacturing process of a solid-state image pickup device in related art.

FIG. 1 shows a member 11 obtained by bonding cover glasses 31-1 and 31-2 cut into pieces on a semiconductor image pickup device 33 with individual transparent heat-resistant resins 32-1 and 32-2, respectively.

This configuration makes it possible to prevent pixel damage due to particles during a semiconductor mounting process.

Figure 2:
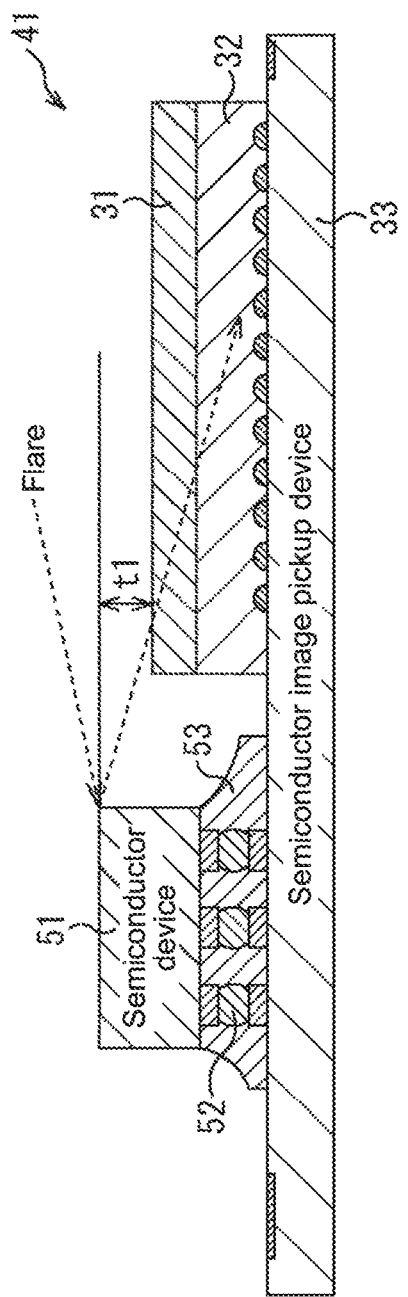
FIG. 2 A diagram for explaining a flare that is generated in a case where, when a semiconductor device is mounted on a position adjacent to a cover glass shown in FIG. 1, an upper surface of the semiconductor device is higher as compared thereto.

Then, in a subsequent step, as shown in FIG. 2, a semiconductor device 51 is connected to a position corresponding to the cover glass 31 of the member 11 through solder bumps 52, and surroundings of the solder bumps 52 are filled with a liquid resin 53 to be cut into pieces, thereby forming a solid-state image pickup device 41.

However, as shown in FIG. 2, in a case where a height of a back surface of the semiconductor device 51 is more than a height of the cover glass 31 (in a case where a height difference t1 is generated in FIG. 2), as indicated by a dotted line of FIG. 2, there is a possibility that a part of incident light is reflected on a side surface portion of the semiconductor device 51 and enters the semiconductor image pickup device 33, with the result that a flare may be generated.

Figure 3:
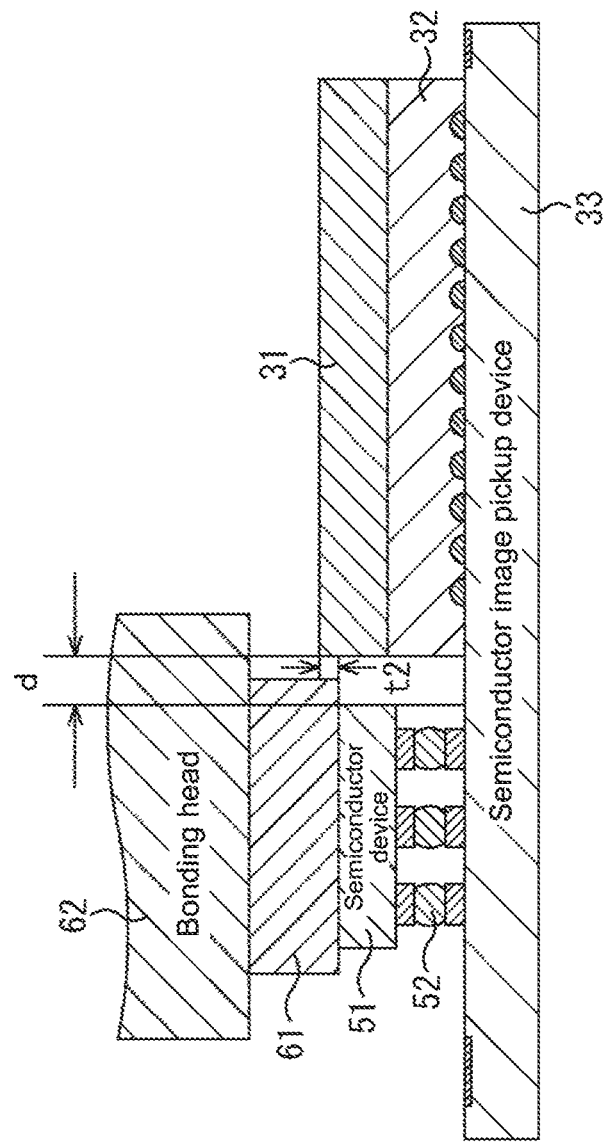
FIG. 3 A diagram for explaining an interference of a jig which is caused in a case where, when the semiconductor device is mounted on a position adjacent to the cover glass shown in FIG. 1, an upper surface of the cover glass is higher as compared thereto.

Further, as shown in FIG. 3, in a case where the height of the semiconductor device 51 is less than the height of the cover glass 31 (in a case where a height difference t2 is generated in FIG. 3), there is a fear that a tip portion 61 of a bonding head 62, which is a bonding jig for mounting the semiconductor device 51 onto the semiconductor image pickup device 33 through the solder bumps 52 may interfere with the cover glass 31. For this reason, it is necessary to determine a position where the semiconductor device 51 is mounted while sufficiently securing a distance d in the figure to such an extent that the tip portion 61 does not interfere with respect to the position where the cover glass 31 is disposed. As a result, the distance d between the semiconductor device 51 and the cover glass 31 has to be secured to some extent. This hinders an apparatus from being downsized and adversely affects impedance therebetween.

<Structure of Solid-State Image Pickup Device According to Present Technology>

Figure 4:
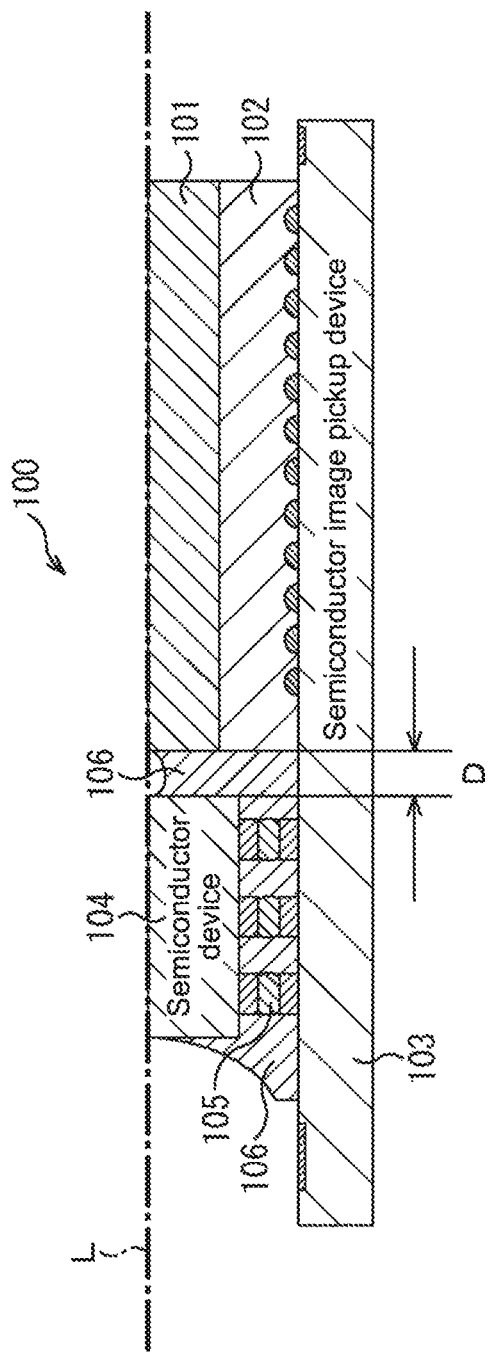
FIG. 4 A diagram for explaining a configuration of a semiconductor apparatus to which the present technology is applied.

In view of the above, the semiconductor image pickup device according to the present technology is configured as shown in FIG. 4.

That is, a solid-state image pickup device 100 shown in FIG. 4 is constituted of a cover glass 101, a transparent heat-resistant resin 102, a semiconductor image pickup device 103, a semiconductor device 104, solder bumps 105, and an underfill resin 106.

Here, the cover glass 101, the transparent heat-resistant resin 102, the semiconductor image pickup device 103, the semiconductor device 104, and the solder bumps 105 correspond to the cover glass 31, the transparent heat-resistant resin 32, the semiconductor image pickup device 33, the semiconductor device 51, and the solder bumps 52 shown in FIG. 1 to FIG. 3, respectively.

Here, the cover glass 101 is in a state of being bonded to the semiconductor image pickup device 103 by the transparent heat-resistant resin 102. It is more desirable that the cover glass 101 is made of a material that behaves in a similar way to silicon Si in terms of linear expansion with respect to temperature, and desirable kinds of glass include silica glass or borosilicate glass.

Further, it is desirable that the transparent heat-resistant resin 102 is made of a material that has not any problem in heat resistance, chemical resistance, and light resistance in a process and a reliability test after the cover glass 101 and the semiconductor image pickup device 103 are bonded to each other, and does not affect image pickup characteristics, for example, a material that transmits light having a wavelength of 400 nm or more by 99% or more.

In addition, the material of the transparent heat-resistant resin 102 is, for example, silicon resin, acrylic resin, epoxy resin, dendrimer, or a copolymer thereof. Further, it is desirable that the transparent heat-resistant resin 102 be capable of forming a resin film on the cover glass 101 side by coating or laminating and, bonding the cover glass on pixels of the semiconductor image pickup device by semi curing. In addition, it is desirable that transparent heat-resistant resin 102 be capable of being cured by heating or irradiation with UV (Ultra Violet) after being bonded between the cover glass 101 and the semiconductor image pickup device 103.

Further, for example, the semiconductor device 104 is an arithmetic element for controlling entire operations of the solid-state image pickup device 100, and is electrically connected to the semiconductor image pickup device 103 through the solder bumps 105.

Between the cover glass 101 and the transparent heat-resistant resin 102, between the semiconductor device 104 and the solder bumps 105, and in a gap among the solder bumps 105, the underfill resin 106 is filled which has a light-blocking property of blocking incident light (or light absorption property) with black color or the like. A transmittance of light within a wavelength range of 380 nm to 1200 nm of the underfill resin is 0%, for example.

Figure 5:
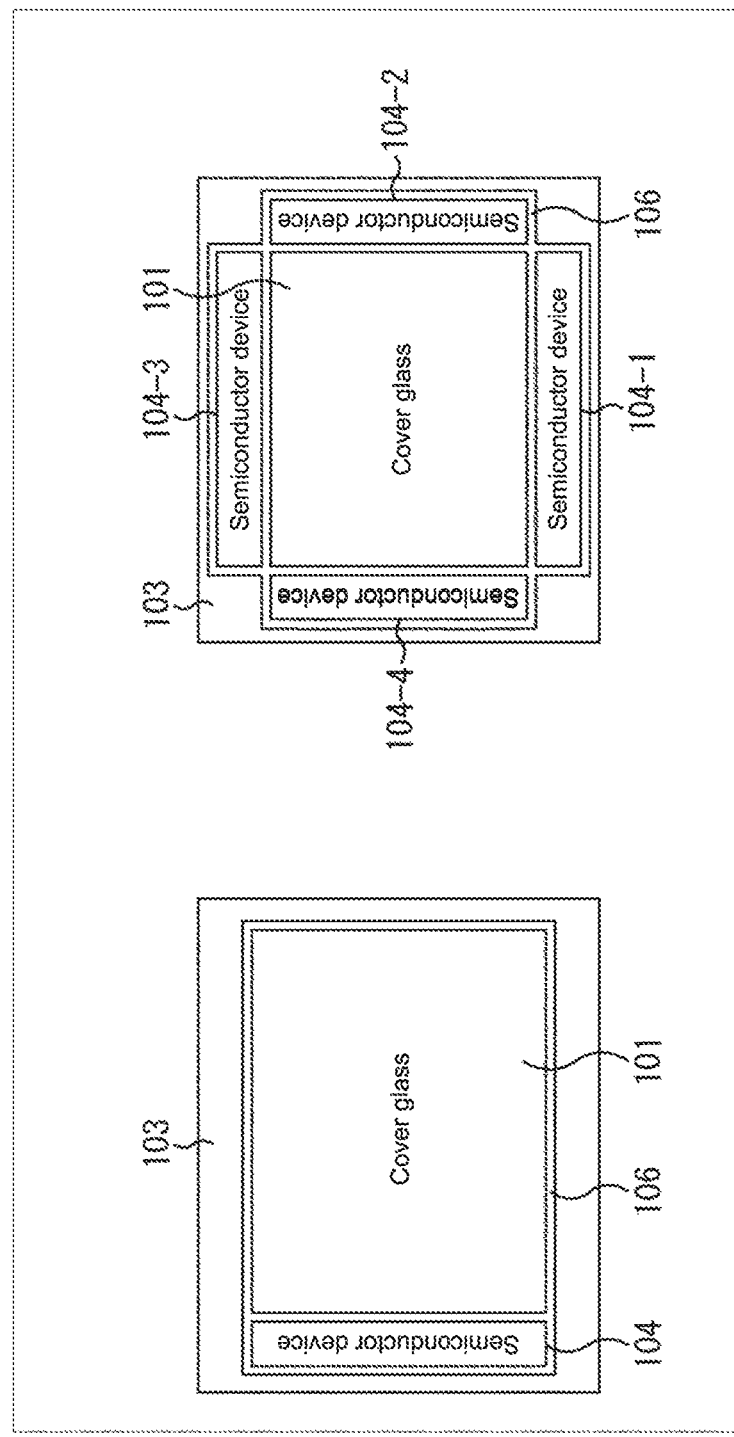
FIG. 5 A diagram for explaining a position where underfill resin is filled.

In addition, as shown in a top view of a left side part of FIG. 5, the underfill resin 106 is filled so as to surround the cover glass 101 and the semiconductor device 104.

Further, at this time, as indicated by the dashed-dotted line shown in FIG. 4, a top surface of the cover glass 101 and a top surface of the semiconductor device 104 are configured so as to be the same height.

Therefore, in mounting the semiconductor device 104 on the semiconductor image pickup device 103, the tip portion 61 of the bonding head 62 as the bonding jig is prevented from interfering with the cover glass 101. Further, it is possible to reduce a horizontal distance D between the semiconductor device 104 and the cover glass 101 shown in FIG. 4 as shown in FIG. 3. In addition, between the semiconductor device 104 and the cover glass 101, the underfill resin 106 having high light-blocking property (or absorption property) is filled, with the result that it is possible to prevent a flare that is generated due to a reflection of outside light on the semiconductor device 104, and the reduction of the distance D can improve mutual impedance characteristics. Furthermore, it is possible to achieve a reduction in entire size of the solid-state image pickup device 100.

It should be noted that the number of semiconductor device 104 does not have to be one with respect to the semiconductor image pickup device 103 or may be a larger number. For example, in a case where four semiconductor devices 104 are provided, as shown in the right side part of FIG. 5, semiconductor devices 104-1 to 104-4 may be disposed so as to surround the cover glass 101. Also in this case, between the cover glass 101 and the semiconductor devices 104-1 to 104-4, in an outer peripheral portion of the semiconductor devices 104-1 to 104-4, and in the gap among the solder bumps 105 that respectively connect the semiconductor device 104-1 to 104-4, the underfill resin 106 having high light-blocking property or light absorption property is filled. As a result, it is possible to suppress a flare, improves the impedance characteristics, and achieve downsizing of the entire apparatus.

<Manufacturing Method>

Subsequently, with reference to FIG. 6, a method of manufacturing the solid-state image pickup device 100 will be described.

Figure 6:
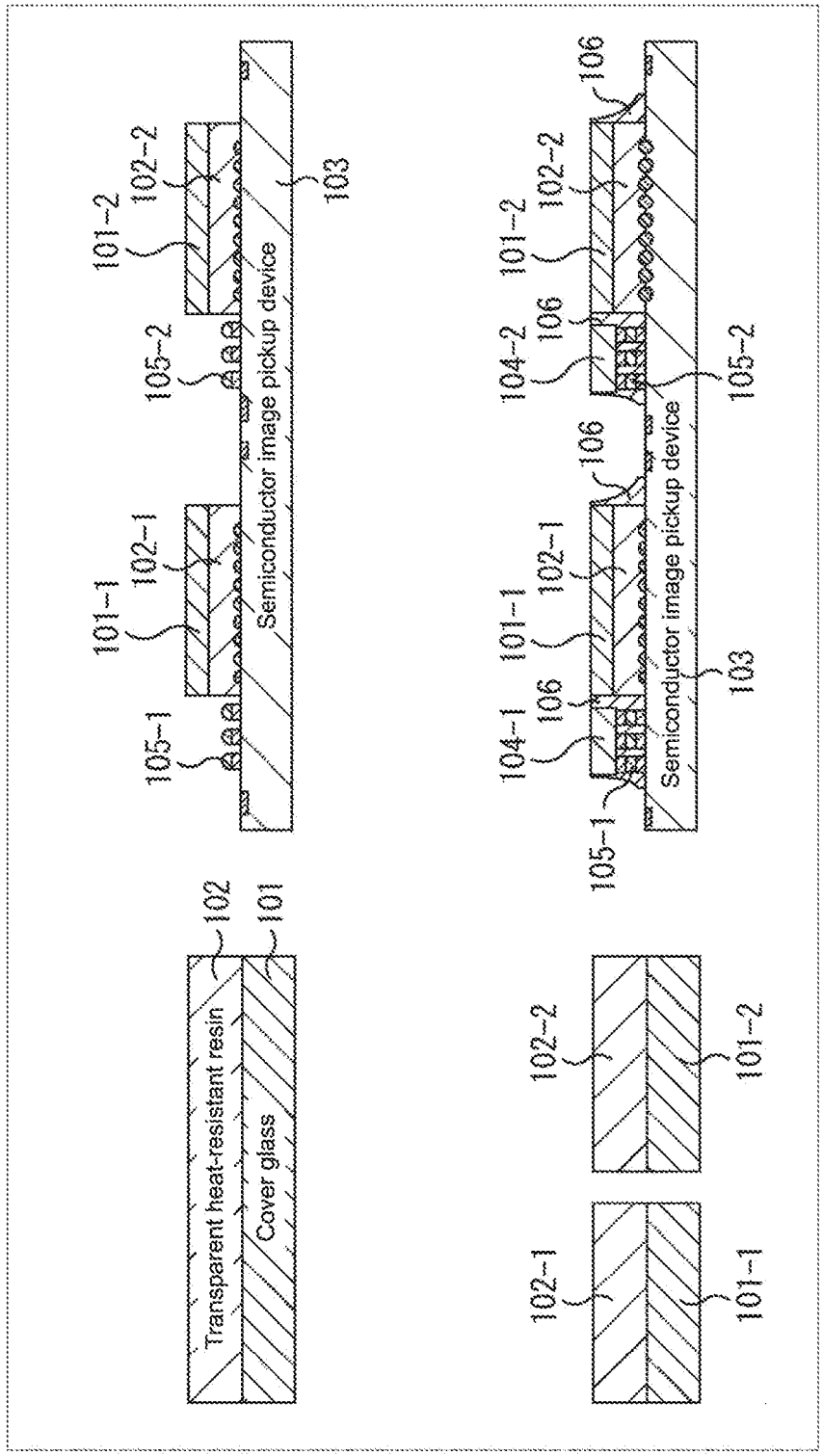
FIG. 6 A diagram for explaining a method of manufacturing the semiconductor apparatus shown in FIG. 4.
Figure 7:
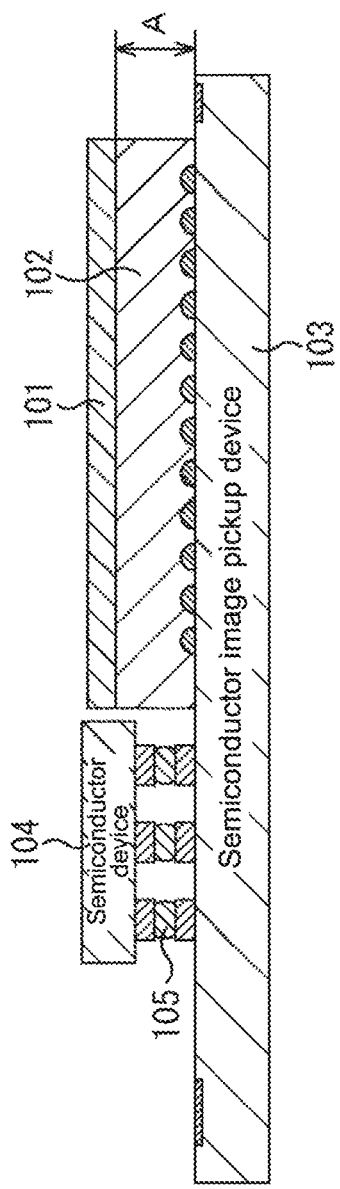
FIG. 7 A diagram for explaining a thickness of transparent heat-resistant resin in the semiconductor apparatus shown in FIG. 4.

In a first process, as shown in the upper left part of FIG. 6, the transparent adhesive resin 102 is bonded on an entire surface of a back surface of the cover glass 101 that is not cut into pieces with the back surface up.

In a second process, as shown in the lower left part of FIG. 6, the cover glass 101 is cut into pieces with the transparent adhesive resin 102 bonded thereto, to obtain cover glasses 101-1 and 101-2, and transparent adhesive resin 102-1 and 102-2, for example.

In a third process, as shown in the upper right part of FIG. 6, the cover glasses 101-1 and 101-2 obtained by the separation into pieces are bonded to a part that forms the solid-state image pickup device 100 on the semiconductor image pickup device 103 by the transparent adhesive resins 102-1 and 102-2. In addition, by electrolytic plating or non-electrolytic plating, electrodes formed of solder bumps 105-1 and 105-2 (or barrier metal or the like) are provided on the semiconductor image pickup device 103.

In a fourth process, as shown in the lower right part of FIG. 6, the semiconductor devices 104-1 and 104-2 are connected to the semiconductor image pickup device 103 through the solder bumps 105-1 and 105-2. At this time, in such a manner that the heights of the back surfaces of the semiconductor devices 104-1 and 104-2 and the heights of the surfaces of the cover glasses 101-1 and 101-2 are the same, the semiconductor devices 104-1 and 104-2 are connected to the semiconductor image pickup device 103 through the solder bumps 105-1 and 105-2. In addition, the underfill resin 106 having the light-blocking property (or absorption property) with respect to light is filled in the bap among the solder bumps 105 and in the gap between the cover glass 101 and the semiconductor device 104 and therearound.

After that, by performing dicing (cut into pieces) in a unit of the solid-state image pickup device 100 (in a unit of the cover glass 101 and the semiconductor device 104 in the figure), the solid-state image pickup device 100 is manufactured. As a result, each solid-state image pickup device 100 is manufactured with the structure as shown in FIG. 4, so it is possible to suppress the flare, improve the impedance characteristics, and achieve the downsizing of the entire apparatus.

<Thickness of Transparent Heat-Resistant Resin>

Incidentally, it is known that when glass is used as a cover member for the semiconductor image pickup device 103 like the cover glass 101, α rays radiated from heavy metals such as uranium 238 (U238) contained in glass adversely affect the characteristics of the semiconductor image pickup device 103. For example, it is known that a taken image white point defect is caused due to an influence of the α rays.

In view of this, in order to reduce the influence of the α rays, it is necessary to consider a thickness that can achieve the reduction of the influence of the α rays by the transparent heat-resistant resin 102 provided between the cover glass 101 and the semiconductor image pickup device 103.

That is, the necessary thickness of the transparent heat-resistant resin 102 to reduce the influence of the α rays is, for example, as shown in FIG. 5, a thickness that satisfies the following expression (1) in a case where a distance from an upper surface of the semiconductor image pickup device 103 to a lower surface of the cover glass 101 is represented by A (um), and a specific gravity of the transparent heat-resistant resin 102 is represented by X.

$$AX \geq 42 \text{ um} \tag{1}$$

Here, 42 um is a distance of the cover glass 101 to an image pickup surface on the semiconductor image pickup device 103, and the distance necessary to prevent the taken image white point defect due to the α rays from the cover glass 101 is determined from a range of the α rays from the uranium 238 (U238) contained in the cover glass 101. Further, a basis of derivation of a condition of the expression (1) is as follows.

That is, a range R defined in the following expression (2) is substantially constant irrespective of a substance.

$$R \text{ (g/cm2)} = d \text{ (g/cm3)} * r \text{ (cm)} \tag{2}$$

A range r of the uranium 238 (U238 (E=4.2 Mev)) in air (d=0.0014 g/cm3) is range r (cm)=3.0 cm. Therefore, the range R defined in the expression (2) is determined as the following expression (3).

$$\begin{aligned} r \text{ (g/cm2)} &= d \text{ (g/cm3)} * r \text{ (cm)} \\ &= 0.0014 \text{ (g/cm3)} * 3.0 \text{ (cm)} \\ &= 4.2E\text{-}03 \text{ (g/cm2)} \end{aligned} \tag{3}$$

Thus, for example, the range r (cm) in the transparent heat-resistant resin 102 of 1 (g/cm3) is determined as indicated by the following expression (4).

$$r\,(\text{cm}) = R\,(\text{g/cm2})/d\,(\text{g/cm3}) \qquad (4)$$
$$= 4.2E\text{-}03\,(\text{g/cm2})/1.0\,(\text{g/cm3})$$
$$= 42\,(\text{um})$$

Thus, by providing the transparent heat-resistant resin 102 having the thickness A determined so as to satisfy the relationship defined by the expression (1) described above, it is possible to reduce the influence of the α rays given to the characteristics of the semiconductor image pickup device 103.

That is, as described above, even in a case where the cover glass 101 prevents the pixel damage due to particles in the semiconductor mounting process, by appropriately setting the thickness of the transparent heat-resistant resin 102 depending on the material thereof, it is possible to reduce the influence of the α rays given to the characteristics of the semiconductor image pickup device 103.

As described above, the solid-state image pickup device 100 according to the present technology prevents, in mounting the semiconductor device 104 on the semiconductor image pickup device 103, the tip portion 61 of the bonding head 62 as the bonding jig from interfering with the cover glass 101.

Further, it is possible to reduce the horizontal distance between the semiconductor device 104 and the cover glass 101. In addition, by filling the underfill resin 106 having high light-blocking property (absorption property) with respect to light between the semiconductor device 104 and the cover glass 101, it is possible to prevent the flare that is generated due to reflection of outside light on the semiconductor device 104.

Furthermore, because the horizontal distance between the semiconductor device 104 and the cover glass 101 can be reduced, it is possible to improve the mutual impedance characteristics between the semiconductor device 104 and the semiconductor image pickup device 103 and achieve the downsizing of the solid-state image pickup device.

Furthermore, by appropriately setting the thickness of the transparent heat-resistant resin 102 as described above, in a case where the cover glass 101 is used as the cover member for the semiconductor image pickup device 103, it is also possible to reduce the influence of the α rays from the heavy metal contained in the glass as the material which is given to the characteristics of the semiconductor image pickup device 103.

<Application Example to Electronic Apparatus>

The solid-state image pickup device described above is applicable to various kinds of electronic apparatuses including an image pickup apparatus such as a digital still camera and a digital video camera, a mobile phone equipped with an image pickup function, and another apparatus equipped with an image pickup function for example.

Figure 8:
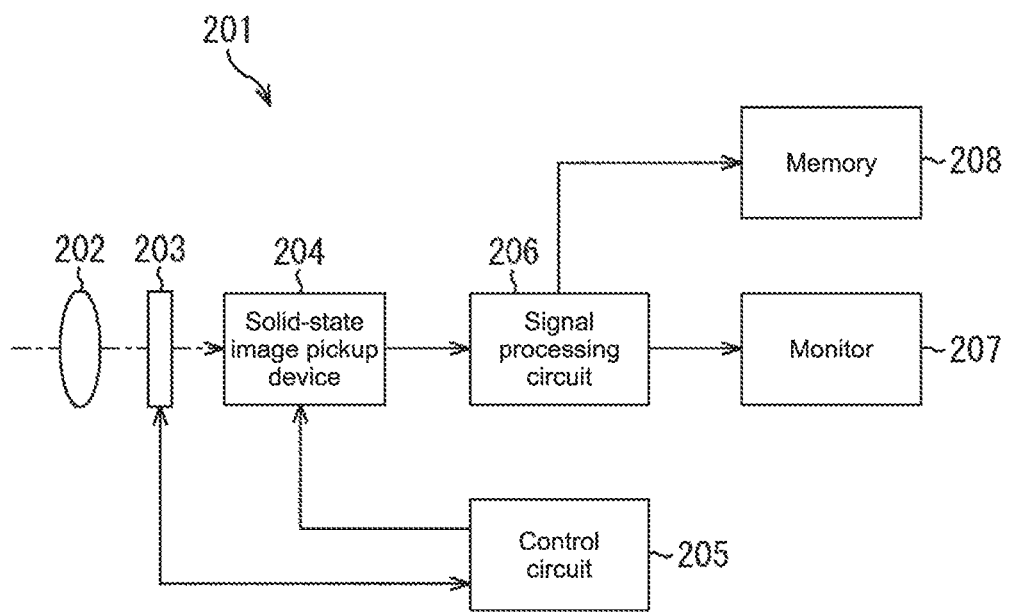
FIG. 8 A diagram for explaining configurations of an image pickup apparatus and an electronic apparatus using a solid-state image pickup device to which the present technology is applied.

FIG. 8 is a block diagram showing a configuration example of an image pickup apparatus as an electronic apparatus to which the present technology is applied.

An image pickup apparatus 201 is provided with an optical system 202, a shutter apparatus 203, a solid-state image pickup device 204, a drive circuit 205, a signal processing circuit 206, a monitor 207, and a memory 208, and is capable of taking a still image and a moving image.

The optical system 202 has one or a plurality of lenses, guides light (incident light) from a subject to the solid-state image pickup device 204, and forms an image on a light reception surface of the solid-state image pickup device 204.

The shutter apparatus 203 is disposed between the optical system 202 and the solid-state image pickup device 204, and in accordance with control of the drive circuit 205, controls light irradiation period and a light-shielding period to the solid-state image pickup device 204.

The solid-state image pickup device 204 is configured by the solid-state image pickup device 100 described above or a package including the solid-state image pickup device 100. The solid-state image pickup device 204 accumulates signal charges for a certain period depending on light imaged on the light reception surface through the optical system 202 and the shutter apparatus 203. The signal charges accumulated in the solid-state image pickup device 204 are transferred in accordance with a drive signal (timing signal) supplied from the drive circuit 205.

The drive circuit 205 outputs a drive signal that controls a transfer operation of the solid-state image pickup device 204 and a shutter operation of the shutter apparatus 203, and drives the solid-state image pickup device 204 and the shutter apparatus 203.

The signal processing circuit 206 performs various signal processes for the signal charged output from the solid-state image pickup device 204. An image (image data) obtained by performing the signal processes by the signal processing circuit 206 is supplied to the monitor 207 to be displayed or supplied to the memory 208 to be stored (recorded).

Also in the image pickup apparatus 201 configured as described above, by applying the solid-state image pickup device 100 instead of the solid-state image pickup device 204 described above, it is possible to reduce the flare, downsize the apparatus, and improves the impedance characteristics of the semiconductor device and the semiconductor image pickup device.

<Usage Example of Solid-State Image Pickup Device>

Figure 9:
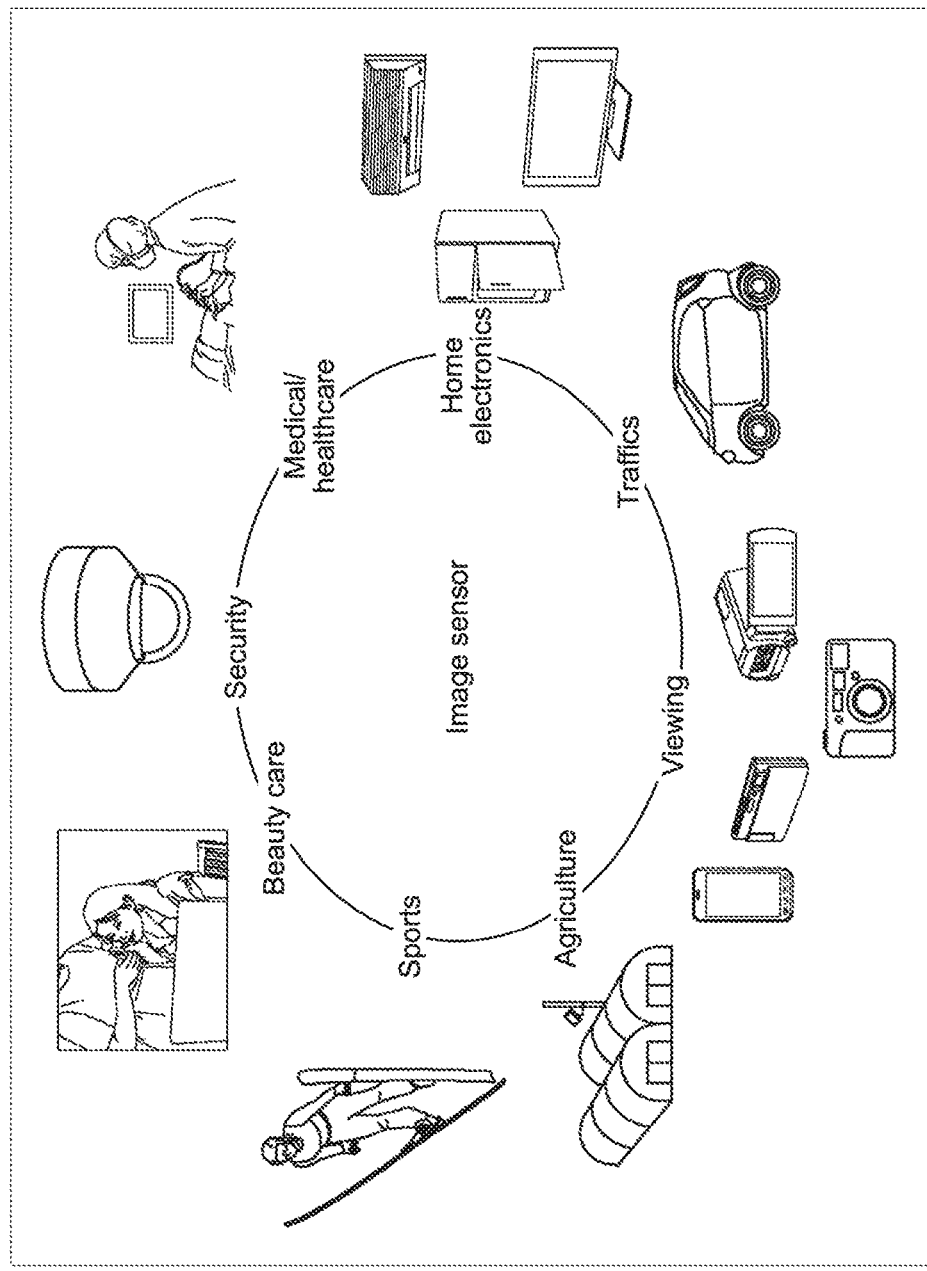
FIG. 9 A diagram showing a usage example of a solid-state image pickup device.

FIG. 9 is a diagram showing a usage example of the solid-state image pickup device 100 described above.

The solid-state image pickup device 100 described above can be used in various cases of sensing light such as visible light, infrared light, ultraviolet light, and X-rays as follows.

- An apparatus for photographing images to be viewed, such as a digital camera and a camera-equipped mobile apparatus
- An apparatus used for traffic purposes, such as a car-mounted camera that photographs front/rear/periphery/inside of an automobile, a surveillance camera that monitors running vehicles and roads, and a distance measurement sensor that measures distances among vehicles, for safe driving including automatic stop, recognition of a driver's state, and the like
- An apparatus used in home electronics such as a TV, a refrigerator, and an air conditioner, for photographing gestures of users and executing apparatus operations according to the gestures
- An apparatus used for medical and healthcare purposes, such as an endoscope and an apparatus that performs blood vessel photographing by receiving infrared light
- An apparatus used for security purposes, such as a surveillance camera for crime-prevention purposes and a camera for person authentication purposes
- An apparatus used for beauty care purposes, such as a skin measurement apparatus that photographs skins and a microscope that photographs scalps
- An apparatus used for sports purposes, such as an action camera and wearable camera for sports purposes
- An apparatus for agriculture purposes, such as a camera for monitoring a state of fields and crops It should be noted that the present technology can take the following configurations.

(1) A semiconductor apparatus, including:
a cover glass that is bonded on a pixel with a transparent heat-resistant resin and cut into pieces to protect the pixel before a semiconductor image pickup device is cut into pieces from a wafer state;
a semiconductor device mounted to be adjacent to the semiconductor image pickup device; and
an underfill resin that is filled in a gap between the cover glass and the semiconductor device and in a periphery of the cover glass and the semiconductor device.

(2) The semiconductor apparatus according to (1, in which the transparent heat-resistant resin has such a thickness (micrometer) that a value obtained by multiplying the thickness by a specific gravity of the transparent heat-resistant resin is more than 42 um (micrometer).

(3) The semiconductor apparatus according to (1) or (2), in which
the transparent heat-resistant resin transmits light having a wavelength of 400 nm or more by 99% or more.

(4) The semiconductor apparatus according to any one of (1) to (3), in which
a height from the pixel on the semiconductor device to a back surface of glass bonded on a pixel is equal to a height to a back surface of the semiconductor device mounted to be adjacent thereto.

(5) The semiconductor apparatus according to any one of (1) to (4), in which
the underfill resin has a transmittance of light within a range of 380 nm to 1200 nm of 0%.

(6) A solid-state image pickup device, including:
a cover glass that is bonded on a pixel with a transparent heat-resistant resin and cut into pieces to protect the pixel before a semiconductor image pickup device is cut into pieces from a wafer state;
a semiconductor device mounted to be adjacent to the semiconductor image pickup device; and
an underfill resin that is filled in a gap between the cover glass and the semiconductor device and in a periphery of the cover glass and the semiconductor device.

(7) An image pickup apparatus, including:
a cover glass that is bonded on a pixel with a transparent heat-resistant resin and cut into pieces to protect the pixel before a semiconductor image pickup device is cut into pieces from a wafer state;
a semiconductor device mounted to be adjacent to the semiconductor image pickup device; and
an underfill resin that is filled in a gap between the cover glass and the semiconductor device and in a periphery of the cover glass and the semiconductor device.

(8) An electronic apparatus, including:
a cover glass that is bonded on a pixel with a transparent heat-resistant resin and cut into pieces to protect the pixel before a semiconductor image pickup device is cut into pieces from a wafer state;
a semiconductor device mounted to be adjacent to the semiconductor image pickup device; and
an underfill resin that is filled in a gap between the cover glass and the semiconductor device and in a periphery of the cover glass and the semiconductor device.

REFERENCE SIGNS LIST 101, 101-1, 101-2 cover glass
102, 102-1, 102-2 transparent heat-resistant resin
103, 103-1, 103-2 semiconductor image pickup device
104, 104-1, 104-2 semiconductor device
105, 105-1, 105-2 solder bump
106 underfill resin

The invention claimed is:
1. A semiconductor apparatus, comprising:
a semiconductor image pickup device;
a transparent heat-resistant resin;
a cover glass bonded to the semiconductor image pickup device with the transparent heat-resistant resin to protect the semiconductor image pickup device,
wherein the cover glass is bonded to a first portion of the semiconductor image pickup device, and
wherein a length of the transparent heat-resistant resin is same as a length of the cover glass;
a semiconductor device on a second portion of the semiconductor image pickup device,
wherein the second portion is different from the first portion,
wherein the second portion is separated from the first portion to form a gap between the cover glass and the semiconductor device, and
wherein the semiconductor device is electrically connected to the semiconductor image pickup device; and
an underfill resin filled in the gap between the cover glass and the semiconductor device and in a periphery of the cover glass and the semiconductor device.

2. The semiconductor apparatus according to claim 1, wherein a thickness of the transparent heat-resistant resin is such that a value obtained by multiplication of the thickness by a specific gravity of the transparent heat-resistant resin is more than 42 um.

3. The semiconductor apparatus according to claim 1, wherein the transparent heat-resistant resin transmits light having a wavelength of 400 nm or more by 99% or more.

4. The semiconductor apparatus according to claim 1, wherein a height from the semiconductor image pickup device to a back surface of the cover glass bonded to the semiconductor image pickup device is equal to a height from the semiconductor image pickup device to a back surface of the semiconductor device.

5. The semiconductor apparatus according to claim 1, wherein the underfill resin has a transmittance of 0% for light within a range of 380 nm to 1200 nm.

6. The semiconductor apparatus according to claim 1, wherein a height of the underfill resin filled in the gap between the cover glass and the semiconductor device is equal to a sum of a height of the cover glass and a height of the transparent heat-resistant resin.

7. A solid-state image pickup device, comprising:
a semiconductor image pickup device;
a transparent heat-resistant resin;
a cover glass bonded to the semiconductor image pickup device with the transparent heat-resistant resin to protect the semiconductor image pickup device,
wherein the cover glass is bonded to a first portion of the semiconductor image pickup device, and
wherein a length of the transparent heat-resistant resin is same as a length of the cover glass;
a semiconductor device on a second portion of the semiconductor image pickup device,
wherein the second portion is different from the first portion,
wherein the second portion is separated from the first portion to form a gap between the cover glass and the semiconductor device, and
wherein the semiconductor device is electrically connected to the semiconductor image pickup device; and an underfill resin filled in the gap between the cover glass and the semiconductor device and in a periphery of the cover glass and the semiconductor device.

8. An image pickup apparatus, comprising:
a semiconductor image pickup device;
a transparent heat-resistant resin;
a cover glass bonded to the semiconductor image pickup device with the transparent heat-resistant resin to protect the semiconductor image pickup device,
wherein the cover glass is bonded to a first portion of the semiconductor image pickup device, and
wherein a length of the transparent heat-resistant resin is same as a length of the cover glass;
a semiconductor device on a second portion of the semiconductor image pickup device,
wherein the second portion is different from the first portion,
wherein the second portion is separated from the first portion to form a gap between the cover glass and the semiconductor device, and
wherein the semiconductor device is electrically connected to the semiconductor image pickup device; and
an underfill resin filled in the gap between the cover glass and the semiconductor device and in a periphery of the cover glass and the semiconductor device.

9. An electronic apparatus, comprising:
a semiconductor image pickup device;
a transparent heat-resistant resin;
a cover glass bonded to the semiconductor image pickup device with the transparent heat-resistant resin to protect the semiconductor image pickup device,
wherein the cover glass is bonded to a first portion of the semiconductor image pickup device, and
wherein a length of the transparent heat-resistant resin is same as a length of the cover glass;
a semiconductor device on a second portion of the semiconductor image pickup device,
wherein the second portion is different from the first portion,
wherein the second portion is separated from the first portion to form a gap between the cover glass and the semiconductor device, and
wherein the semiconductor device is electrically connected to the semiconductor image pickup device; and
an underfill resin filled in the gap between the cover glass and the semiconductor device and in a periphery of the cover glass and the semiconductor device.

* * * * *